(12) United States Patent

Kodner et al.

(10) Patent No.: US 12,671,367 B2

(45) Date of Patent: Jun. 30, 2026

(54) PEAK CURRENT REDUCTION IN COMMUNICATION DEVICES

(71) Applicant: MOTOROLA SOLUTIONS, INC., Chicago, IL (US)

(72) Inventors: Lionid Kodner, Modi'in-Maccabim-Re'ut (IL); Mark Rozental, Gedera (IL); Alexander Gomelsky, Holon (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 690 days.

(21) Appl. No.: 18/056,964

(22) Filed: Nov. 18, 2022

(65) Prior Publication Data

US 2024/0171130 A1     May 23, 2024

(51) Int. Cl.
| | |
|---|---|
| H03F 1/32 | (2006.01) |
| H03F 3/24 | (2006.01) |
| H03K 3/037 | (2006.01) |
| H03K 19/20 | (2006.01) |
| H04B 1/04 | (2006.01) |

(52) U.S. Cl.
CPC .............. H03F 1/32 (2013.01); H03F 3/245 (2013.01); H03K 3/037 (2013.01); H04B 1/04 (2013.01); H03F 2200/451 (2013.01); H03F 2200/462 (2013.01); H03K 19/20 (2013.01)

(58) Field of Classification Search
CPC ...... H03F 1/32; H03F 3/245; H03F 2200/451; H03F 2200/462; H03F 2200/471; H03F 1/345; H03F 1/52; H03F 2200/78; H03F 3/213; H03F 3/195; H03K 3/037; H03K 19/20; H04B 1/04; H04B 1/40;
(Continued)

(56) References Cited

U.S. PATENT DOCUMENTS

| | | | |
|---|---|---|---|
| 5,748,038 A | 5/1998 | Boscovic et al. |
| 7,474,149 B2 | 1/2009 | Snelgrove |

(Continued)

FOREIGN PATENT DOCUMENTS

| | | |
|---|---|---|
| EP | 0638994 B1 | 11/1998 |
| GB | 2281668 A | 3/1995 |

(Continued)

OTHER PUBLICATIONS

International Search Report and Written Opinion for Application No. PCT/US2023/078146 dated Feb. 15, 2024 (17 pages).

*Primary Examiner* — Lana N Le

(74) *Attorney, Agent, or Firm* — Michael Best & Friedrich LLP

(57) ABSTRACT

Peak maximum current control for a wireless communication device. One example provides a radio including a radio frequency power amplifier (RFPA) and a current measuring circuit configured to sense a current provided to the RFPA. A comparator is connected to the current measuring circuit. The comparator is configured to compare a value indicative of the current provided to the RFPA to a threshold and provide an output indicative of the comparison. The radio includes a switching circuit configured to receive the output from the comparator and generate an amount of attenuation based on the output. A Cartesian feedback loop is configured to receive the amount of attenuation and control the output of the RFPA.

20 Claims, 6 Drawing Sheets

(58) Field of Classification Search
CPC .............. H04B 2001/0408; H04B 1/16; H04B 2001/0416; H04B 7/005; H04B 1/0475
See application file for complete search history.

(56) References Cited

U.S. PATENT DOCUMENTS

| | | | |
|---|---|---|---|
| 7,502,599 B2 | 3/2009 | Ben-Ayun et al. | |
| 7,934,107 B2 | 4/2011 | Walrath | |
| 10,285,081 B1 | 5/2019 | Bartels et al. | |
| 2003/0232608 A1* | 12/2003 | Yamauchi | H03G 3/3052 |
| | | | 455/136 |
| 2004/0178852 A1* | 9/2004 | Neunaber | H03F 1/52 |
| 2005/0123064 A1 | 6/2005 | Ben-Ayun et al. | |
| 2006/0145764 A1 | 7/2006 | Chacko et al. | |
| 2006/0148430 A1* | 7/2006 | Leizerovich | H04B 1/0475 |
| | | | 455/127.1 |
| 2008/0214125 A1* | 9/2008 | Haque | H04B 1/0458 |
| | | | 455/126 |
| 2010/0022209 A1 | 1/2010 | Ng et al. | |
| 2011/0227642 A1* | 9/2011 | Hoyerby | H03F 3/24 |
| | | | 330/109 |
| 2015/0358038 A1* | 12/2015 | Koskinen | H03F 3/245 |
| 2016/0277044 A1* | 9/2016 | Song | H04B 1/04 |
| 2017/0093341 A1* | 3/2017 | Poulin | H03F 3/189 |
| 2017/0365598 A1* | 12/2017 | Yamaji | H01L 21/761 |
| 2019/0190549 A1 | 6/2019 | Corse et al. | |
| 2021/0234523 A1* | 7/2021 | Morisawa | H03F 3/245 |
| 2023/0038733 A1* | 2/2023 | Blin | H04B 1/40 |

FOREIGN PATENT DOCUMENTS

| | | | | |
|---|---|---|---|---|
| GB | 2466072 A | | 6/2010 | |
| JP | H09199950 A | * | 7/1997 | .............. H03F 1/52 |
| JP | 2004194355 A | * | 7/2004 | |
| KR | 20100010231 A | * | 2/2010 | .............. H03F 3/24 |
| WO | 2008137229 A1 | | 11/2008 | |
| WO | 2010011459 A2 | | 1/2010 | |

* cited by examiner

PEAK CURRENT REDUCTION IN COMMUNICATION DEVICES

BACKGROUND OF THE INVENTION

Radios and other wireless communication devices use antennas to transmit and receive radio frequency (RF) signals. Wireless communication devices also include a transmitter and a receiver (and sometimes a transceiver). A typical transmitter includes a power amplifier to amplify the signals before they are coupled to the antenna for transmission. A number of modern radio communication systems work in narrow frequency bands, and the transmitters in such systems generally require RF power amplifiers that operate in a linear fashion. Linear amplification helps to reduce distortion of the amplified signal and to reduce transmission interference. However, real world RF amplifiers often operate in a non-linear manner when they are operated at high drive levels.

One technique of linearization is to use a Cartesian feedback loop. Using a Cartesian feedback loop helps to maintain linearity of the RF power amplifier while still allowing the amplifier to work close to its saturation point. Operating near the saturation point helps an amplifier operate efficiently.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate examples, instances, and/or aspects of concepts that include the claimed subject matter, and explain various principles and advantages of examples, instances, and/or aspects.

Figure 1:
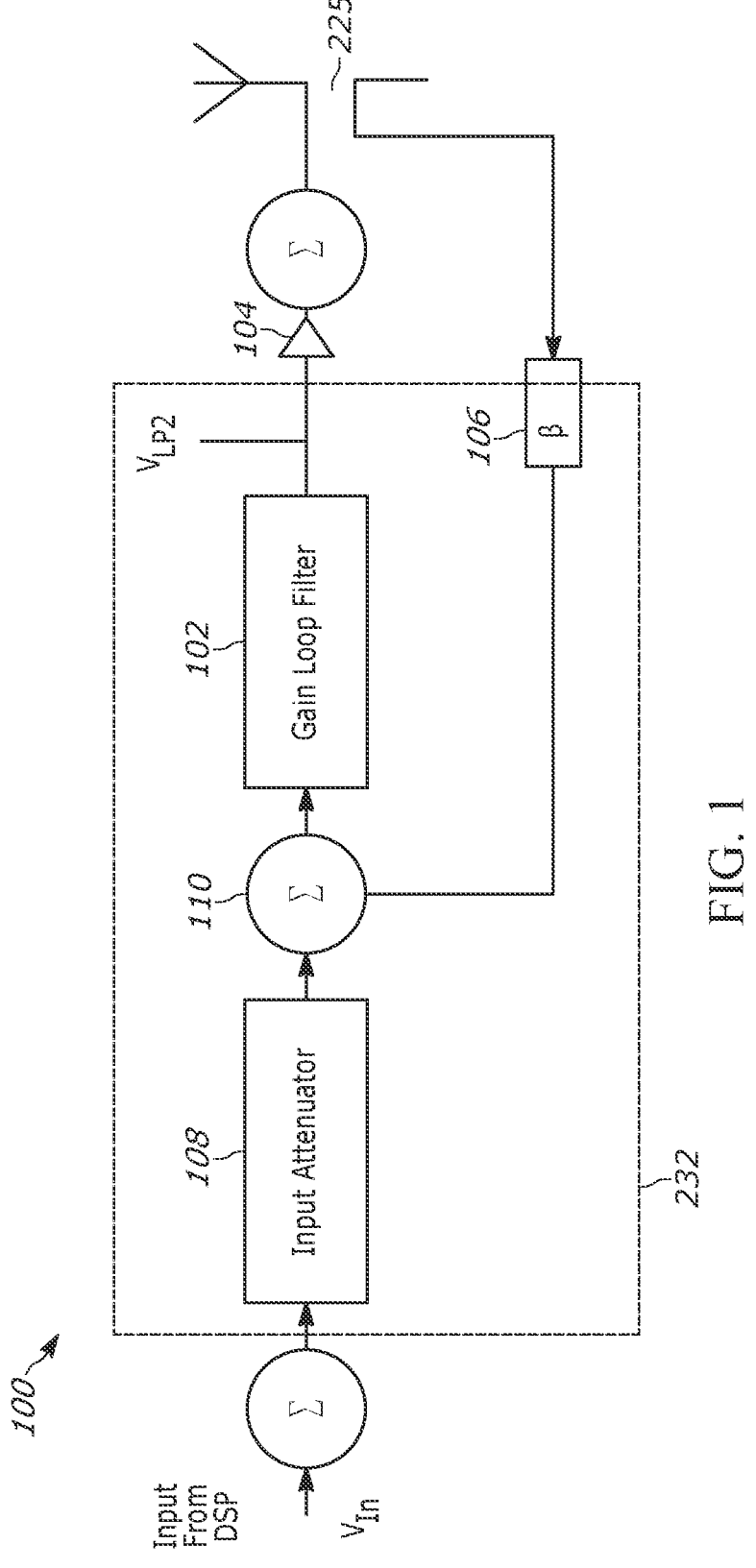
FIG. 1 is a diagram of a Cartesian feedback loop transmitter, according to one example.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of examples.

The apparatus and method components have been represented where appropriate by conventional symbols in the drawings, showing only those specific details that are pertinent to understanding the examples, instances, and aspects illustrated so as not to obscure the disclosure with details that will be readily apparent to those of ordinary skill in the art having the benefit of the description herein.

DETAILED DESCRIPTION OF THE INVENTION

In battery powered devices, the maximum peak current that can be drawn from the battery is limited. Consuming more than the maximum allowed current from a battery may activate battery protection circuits or other protective operations, resulting in a disconnected battery or temporary device shutdown operation. Additionally, high peak current consumption can lead to a battery voltage drop, resulting in a premature device shutdown due to lack of battery power.

These maximum peak current issues may be more severe in devices with multiple modems, such as converged wireless communication devices (for example, a converged device). A converged device is a device capable of communicating within multiple communication systems implementing different communication protocols. For example, a converged device may communicate (or operate) in a Land Mobile Radio (LMR) communication system and a Long-Term Evolution (LTE) communication system. There are numerous LMR protocols, for example, the Project 25 (P25) standard defined by the Association of Public Safety Communications Officials International (APCO), the Terrestrial Trunked Radio (TETRA) standard defined by the European Telecommunication Standards Institute (ETSI), the Digital Private Mobile Radio (dPMR) standard also defined by the ETSI, and the Digital Mobile Radio (DMR) standard also defined by the ETSI. LTE protocols include, for example, LTE-Advanced or LTE-Advanced Pro compliant with, for example, the 3GPP TS 36 specification series, or the 5G standard (including a network architecture compliant with, for example, the 3GPP TS 23 specification series and a new radio (NR) air interface compliant with the 3GPP TS 38 specification series), among other possibilities.

For wireless devices communicating in accordance with a TETRA protocol, TETRA linear radio frequency power amplifier (RFPA) current changes based on the antenna voltage standing wave ratio (VSWR). Specifically, with higher VSWR, the linear RFPA output power capability can increase, coupling of the directional coupler can change, overall peak current drain increases, and RFPA power increases. The ATEX standard experiences even more severe current drain and power limitation. Accordingly, the need to limit maximum peak current in battery-powered communication devices is particularly important.

Examples described herein provide, among other things, a current measuring circuit for monitoring the current provided to an RFPA. Additional components are provided for controlling an amount of feedback attenuation in the Cartesian feedback loop based on the value of the current provided to the RFPA. By varying the amount of Cartesian feedback loop transmitter feedback path attenuation based on the RFPA current value, the RF power draw of the RFPA is reduced, and therefore the peak current is reduced.

One example provides a radio including a radio frequency power amplifier and a current measuring circuit configured to sense a current provided to the radio frequency power amplifier. The radio includes a comparator connected to the current measuring circuit and configured to compare a value indicative of the current provided to the radio frequency power amplifier to a threshold and configured to provide an output indicative of the comparison. The radio includes a switching circuit configured to receive the output from the comparator and generate an amount of attenuation based on the output. The radio includes a Cartesian feedback loop configured to receive the amount of attenuation and control the output of the radio frequency power amplifier.

Another example provides a method for current control in a radio. The method includes sensing, with a current measuring circuit, a current provided to a radio frequency power amplifier and comparing, with a comparator connected to the current measuring circuit, a value indicative of the current provided to the radio frequency power amplifier to a threshold. The method includes providing, with the comparator, an output indicative of the comparison and receiving, with a switching circuit, the output from the comparator. The method includes generating, with the switching circuit, an amount of attenuation based on the output, receiving, with a Cartesian feedback loop, the amount of attenuation from the switching circuit, and controlling, with the Cartesian feedback loop, the output of the radio frequency power amplifier.

FIG. 1 provides an example Cartesian loop transmitter 100. The Cartesian loop transmitter 100 include a radio frequency power amplifier (RFPA) 104 that is biased in class AB. The RFPA 104 has a standalone adjacent channel power (ACP) of approximately 30 dB at nominal output power (1 Watt at its antenna). The ACP of the RFPA 104 is improved by the Cartesian loop gain ((3A) at an offset frequency of interest. For example, it may be assumed that a 25 kHz offset provides a loop gain of 40 dB, and closed loop ACP at a 25 kHz offset will be 30 dB (nominal power ACP)+40 dB (loop gain with offset)=70 dB. If the RFPA 104 is driven into compression by voltage standing wave ratio (VSWF) changes, its small signal gain drops significantly. When the RFPA 104 is driven into compression, while operating inside the Cartesian loop transmitter 100, the loop gain (βA) will drop by the same amount as the RFPA 104 small signal gain drops. For example, if under some VSWR, RFPA 104 small signal gain drops by 10 dB, then the loop gain (βA) becomes 40 dB−10 dB=30 dB and the resultant ACP at the antenna will be 30 dB+30 dB=60 dB. Resultant loop ACP will be degraded by the amount of RFPA small signal gain reduction.

In the example of FIG. 1, the transfer function between the voltage provided to the RFPA 104 ($V_{LP2}$) and a transmission signal input ($V_{IN}$) from a digital signal processor (DPS) input into the Cartesian loop transmitter 100 can be expressed as:

$$\frac{V_{LP2}}{V_{in}} = \frac{ATT_{in} \cdot H(j\omega)}{1 + H(j\omega) \cdot g \cdot \beta}$$

where
H(jω)—is a loop filter transfer function;
β—is a loop feedback gain 106;
g—is the RFPA 104 small signal gain;
$V_{in}$—is the input voltage to the Cartesian loop transmitter 100; and
$V_{LP2}$—is the voltage after the gain loop filter 102 and before the RFPA 104.
For H(jω)·g·β>>1, the transfer function can be approximated as follows:

$$\frac{V_{LP2}}{V_{in}} \approx ATT_{in} \frac{1}{g \cdot \beta}$$

Note that g is the RFPA 104 small signal gain.

As shown by this transfer function, if the RFPA 104 gain drops due to VSWR, the signal at LP2 increases. Accordingly, the loop small signal gain change may be estimated by observing the voltage provided to the RFPA 104 ($V_{LP2}$) during transmitting. If the small signal gain of the loop drops, the drive to the loop can be reduced by increasing attenuation of input attenuator 108 that is located before the loop summing junction 110.

To accurately estimate loop small signal gain changes together with a baseband signal, a small signal is transmitted. The small signal may be transmitted at a +12.5 kHz (or −12.5 kHz) offset. The power of this small signal may be 30 dB below the baseband signal transmitted power. Under such conditions, this small signal does not influence the baseband signal 25 kHz ACP. The small signal is detected at LP2 by passing it through a bandpass filter. The root mean square voltage of the small signal is monitored.

The generated small signal is always K (e.g., K=−30 dB) below the baseband signal power. Accordingly, at the loop input, K may be expressed as follows:

$$\frac{P_{in}(\text{small signal})}{P_{in}(\text{baseband})} = K$$

A level of the baseband signal $P_{LP2}$ (baseband) and a level of said small signal $P_{LP2}$ (small signal) are measured at $V_{LP2}$ The relation between ratios of input signals and signals measured at $V_{LP2}$ may be described as follows:

$$R = \frac{\dfrac{P_{LP2}(\text{small signal})}{P_{LP2}(\text{baseband})}}{\dfrac{P_{in}(\text{small signal})}{P_{in}(\text{baseband})}} = \frac{\dfrac{P_{LP2}(\text{small signal})}{P_{LP2}(\text{baseband})}}{K}$$

In the linear region, R will be equal to 1. However, when the RFPA 104 is driven into compression, the small signal power at $V_{LP2}$ will increase, and the ratio will increase to:

$$\frac{P_{LP2}(\text{small signal})}{P_{LP2}(\text{baseband})}$$

In the compression region, R becomes larger than 1. The Cartesian loop transmitter 100 according to some examples described herein controls input loop attenuators for keeping the ratio R within a pre-defined range (between thresholds THR1 and THR2) and at the same time keeping ACP within a limit.

Figure 2:
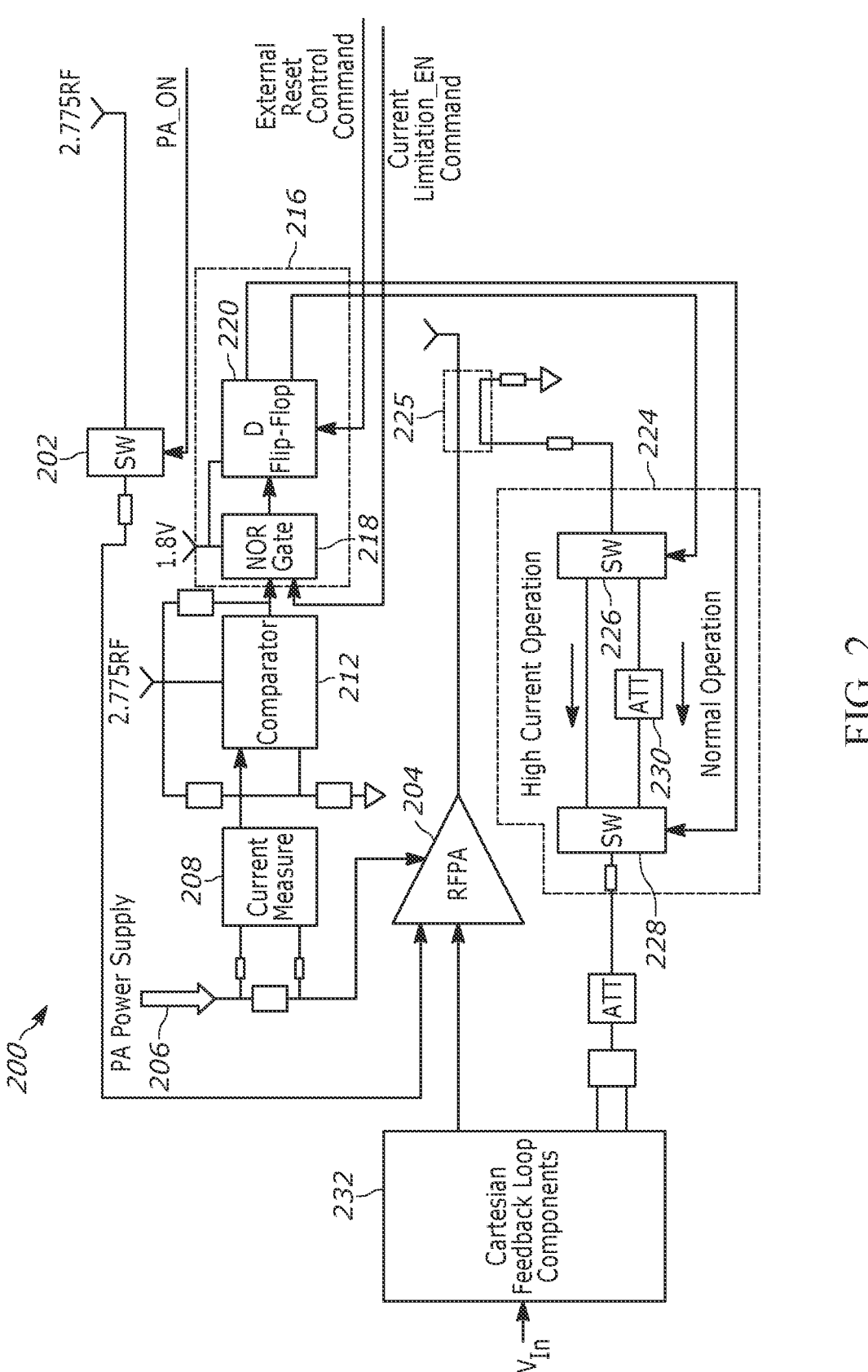
FIG. 2 is a schematic diagram of a current feedback circuit for a communication device, according to one example.

For some antenna VSWR values (and, in some instances, reflection complex coefficients), the power output capability and small signal RFPA gain can increase. Thus, the RFPA may consume more current than possible from the radio battery. Some examples described herein control the maximum peak current of a communication device by controlling the amount of loop feedback gain 106 based on monitored current. FIG. 2 provides an example current feedback circuit 200 for a communication device. In the example shown, the current feedback circuit 200 includes, among other things, RFPA enable switch 202, an RFPA 204, and a power supply 206. The RFPA 204 may, for example, correspond to the RFPA 104 of FIG. 1. The RFPA enable switch 202 controls whether the RFPA 204 is enabled. For example, when the communication device begins transmission, the RFPA enable switch 202 receives a PA_ON command to activate the RFPA 204. Power is provided to the RFPA 204 from the power supply 206. Current provided to the RFPA 204 from the power supply 206 is measured by a current measuring circuit 208. Cartesian feedback loop components 232 include, with reference to FIG. 1, the input attenuator 108, loop summing junction 110, gain loop filter 102, and at least part of the loop feedback gain 106. In some instances, the input attenuator 108, the loop summing junction 110, the gain loop filter 102, and the loop feedback gain 106 collectively form an integrated circuit that includes Cartesian feedback loop components. In some implementations, the Cartesian loop transmitter 100 includes a directional coupler 225 that couples RFPA power to the attenuator 230.

The current measuring circuit 208 provides a signal (e.g., a voltage having a value) indicative of the measured current value to a comparator 212. The comparator 212 compares the signal indicative of the measured current value to a current threshold. The comparator 212 provides a signal indicative of the comparison to a logic circuit 216. For example, when the measured current value is greater than or equal to the current threshold, the comparator 212 may output a low logic level signal (for example, 0.5V) to the logic circuit 216. When the measured current value is less than or equal to the current threshold, the comparator 212 may output a high logic level signal (for example, 0.7V*Vcc) to the logic circuit 216.

The logic circuit 216 generates commands for controlling a switching circuit 224 based on the signal from the comparator 212. For example, the switching circuit 224 includes a first switch 226 and a second switch 228. The first switch 226 and the second switch 228 are controlled to set an amount of feedback attenuation provided to the Cartesian feedback loop components 232 (for example, by connecting attenuator 230 to the Cartesian feedback loop components 232). In some instances, the switching circuit 224 is controlled between at least two operating modes, which in one instance are a high current operating mode and a normal operating mode. During the normal operating mode, the attenuator 230 is connected to the Cartesian feedback loop components 232, decreasing the attenuation value of the loop feedback gain 106. During the high current operating mode, the attenuator 230 is disconnected from the Cartesian feedback loop components 232, increasing the total value of the loop feedback gain 106. When the second signal from the comparator 212 is the high logic signal, the logic circuit 216 controls the switching circuit 224 to select the normal operating mode. When the signal from the comparator 212 is the low logic signal, the logic circuit 216 controls the switching circuit 224 to select the high current operating mode. As the attenuation value increases for the high current operating mode, the output power (and therefore the current) for operating the RFPA 204 decreases.

In some implementations, the logic circuit 216 also receives commands from a controller, such as a "current limitation enable" command and an "external reset control" command. The current limitation enable command indicates whether a maximum current limitation control is enabled. When the current limitation enable command has a disable value the logic circuit 216 ignores the signal from the comparator 212 and maintains the switching circuit 224 in the normal operating mode, regardless of the measured current value. When the current limitation enable command has an enable value the logic circuit 216 controls the switching circuit 224 based on the signal from the comparator 212, as previously described.

When the communication device is a TETRA radio, the external reset control command may be a signal indicating a transmission (TX) slot beginning or a TX session beginning. When the external reset control command is disabled (for example, indicates the beginning of a TX slot), the logic circuit 216 ignores the second signal from the comparator 212 and maintains the switching circuit 224 in the normal operating mode, regardless of the measured current value and the current limitation enable command. When the external reset command is enabled and the current limitation enable command is also enabled, the logic circuit 216 controls the switching circuit 224 based on the signal from the comparator 212, as previously described.

In the example current feedback circuit 200 of FIG. 2, the logic circuit 216 includes a NOR gate 218 and a D Flip-Flop 220. The NOR gate 218 receives the signal from the comparator 212 and the current limitation enable command as inputs. When the signal from the comparator 212 and the current limitation enable command are both LOW, the NOR gate 218 outputs a HIGH signal to the D Flip-Flop 220. Otherwise, the NOR gate 218 outputs a LOW signal to the D Flip-Flop 220.

The D Flip-Flop 220 receives the output of the NOR gate 218 and the external reset control command as inputs. The D Flip-Flop 220 generates commands for the first switch 226 and the second switch 228 based on the output of the NOR gate 218 and the external reset control command. In some instances, once the high current operating mode is initiated, the D Flip-Flop 220 maintains the high current operating mode until being reset by the external reset control command. The external reset control command may reset the switching circuit 224 to the normal operating mode at the end of a TX slot, at the end of a TX session, or when the controller decides that the reason that caused the increase of peak current has been resolved.

While the example current feedback circuit 200 of FIG. 2 illustrates the logic circuit 216 as including the NOR gate 218 and the D Flip-Flop 220, in some implementations, other digital logic components are provided to perform the functions of the logic circuit 216. Additionally, in some implementations, the logic circuit 216 is removed from the current feedback circuit 200. In such an instance, the switching circuit 224 may be controlled directly by the signal from the comparator 212.

Figure 3:
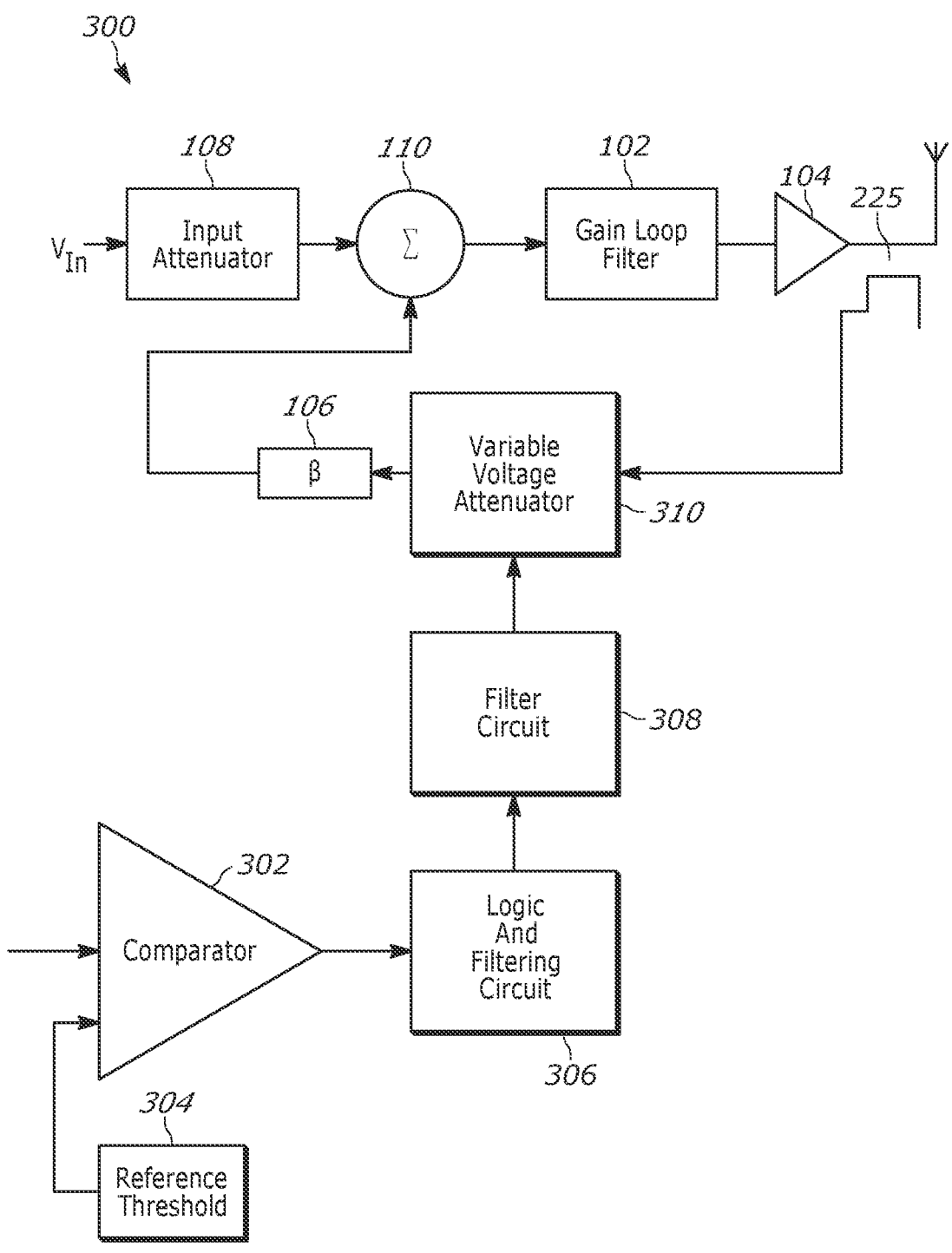
FIG. 3 is a schematic diagram of an attenuation circuit, according to one example.

In some instances, a variable voltage attenuator is implemented to adjust the value of the loop feedback gain 106. FIG. 3, for example, illustrates an example attenuator circuit 300 connected to the Cartesian loop transmitter 100 of FIG. 1. The attenuator circuit 300 includes a comparator 302, a reference voltage 304, a logic and level shifting circuit 306, a filtering circuit 308, and a variable voltage attenuator control input 310. The attenuator circuit 300 may replace the comparator 212, the logic circuit 216, and the switching circuit 224 in FIG. 2.

The comparator 302 receives the first signal indicative of the measured current value from the current measuring circuit 208. The comparator 302 compares the first signal to the reference voltage 304 to generate a comparator output. In some implementations, when the first signal is less than the reference voltage 304, the comparator 302 generates a "LOW" output signal. When the first signal is greater than or equal to the reference voltage 304, the comparator 302 generates a "HIGH" output signal. The comparator output is applied to the logic and level shifting circuit 306 and the filtering circuit 308, thereby conditioning the comparator output. In some instances, the filtering circuit 308 includes a low-pass filter to smooth the transition between different attenuation values and achieve lower ACP during the transition. The conditioned comparator output is provided to the variable voltage attenuator control input 310.

When the comparator 302 generates a "LOW" output signal, the variable voltage attenuator control input 310 generates a first attenuation value (corresponding to the normal operating mode of FIG. 2). When the comparator 302 generates a "HIGH" output signal, the variable voltage attenuator control input 310 generates a second attenuation value less than the first attenuation value (corresponding to the high current operating mode of FIG. 2). The second attenuation value may be less than the first attenuation value by an offset attenuation value that may be pre-programmed into the variable voltage attenuator control input 310.

Figure 4:
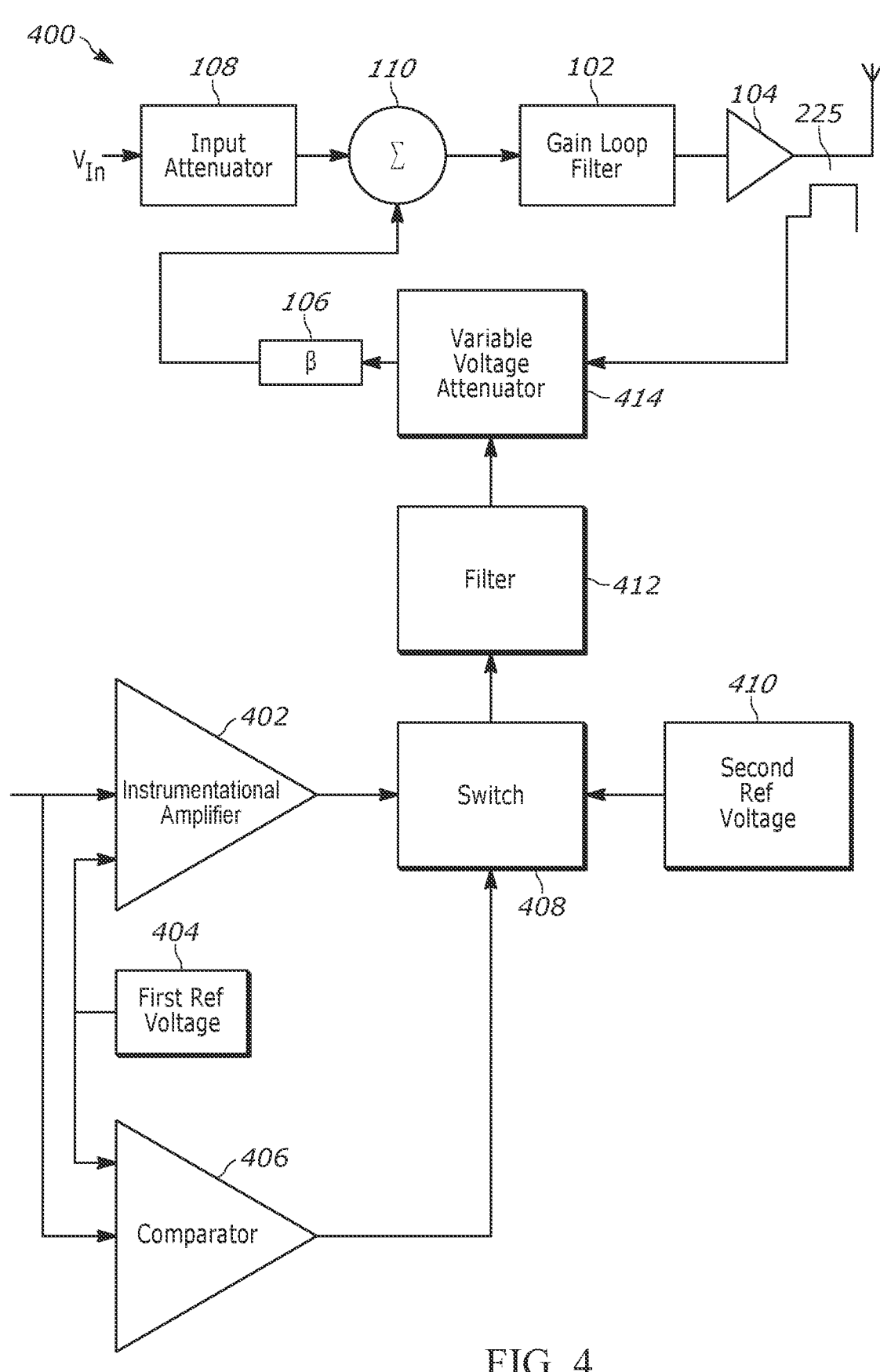
FIG. 4 is a schematic diagram of an attenuation circuit, according to another example.

FIG. 4 illustrates another example attenuator circuit 400 connected to the Cartesian loop transmitter 100 of FIG. 1. The attenuator circuit 400 includes an instrumental amplifier 402, a first reference voltage 404, a comparator 406, a switch 408, a second reference voltage 410, a filtering circuit 412, and a variable voltage attenuator 414. The attenuator circuit 400 may replace the comparator 212, the logic circuit 216, and the switching circuit 224 in FIG. 2.

The outputs of the comparator 406 controls the position of the switch 408. For example, the instrumental amplifier 402 and the comparator 406 both receive the first signal indicative of the measured current value from the current measuring circuit 208. When the first signal is less than the first reference voltage 404, the comparator 406 outputs a "LOW" signal to the switch 408. The "LOW" signal controls the switch 408 to a first position that connects the second reference voltage 410 to the filtering circuit 412 and the variable voltage attenuator 414. When the switch 408 is in the first position, the instrumental amplifier 402 is disconnected from the filtering circuit 412 and the variable voltage attenuator 414. When the variable voltage attenuator 414 receives the second reference voltage 410, the variable voltage attenuator 414 generates a first attenuation value.

When the first signal is greater than or equal to the first reference voltage 404, the comparator 406 outputs a "HIGH" signal to the switch 408. The "HIGH" signal controls the switch 408 to a second position that connects the instrumental amplifier 402 to the filtering circuit 412 and the variable voltage attenuator 414. When the switch 408 is in the second position, the second reference voltage 410 is disconnected from the filtering circuit 412 and the variable voltage attenuator 414. The output of the instrumental amplifier 402 is proportional to the difference between the first signal and the first reference voltage 404. Accordingly, while receiving the output of the instrumental amplifier 402, the amount of attenuation generated by the variable voltage attenuator 414 varies continuously and proportionally to the difference between the first signal and the first reference voltage 404. Thus, the output power of the RFPA 204 (and therefore the peak current draw of the RFPA 204) varies (or is reduced) continuously. The continuous reduction of RFPA output power results in low ACP during the power transition.

Figure 5:
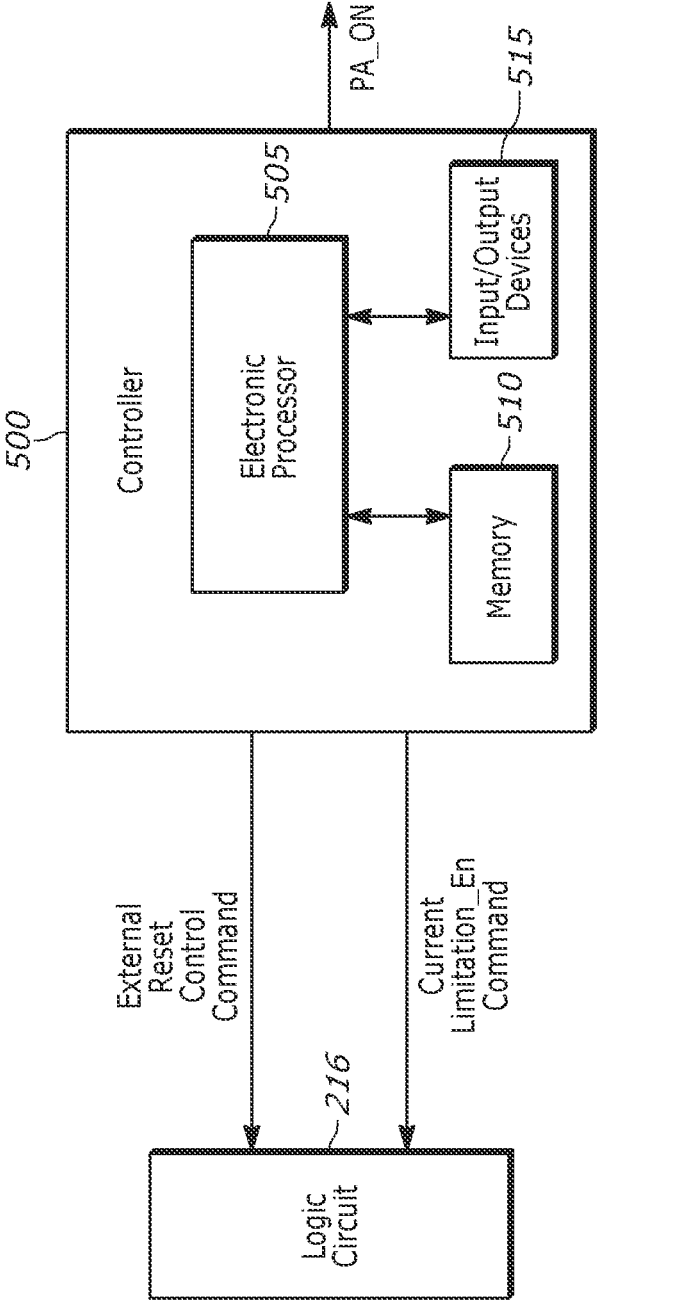
FIG. 5 is a block diagram of a controller for a communication device, according to one example.

FIG. 5 provides an example controller 500 for a wireless communication device. In the example shown, the controller 500 includes an electronic processor 505 (for example, a microprocessor or another electronic device), a memory 510, and input/output devices 515. The memory 510 may include read only memory (ROM), random access memory (RAM, other non-transitory computer-readable media, or a combination thereof. The electronic processor 505 is configured to, among other things, retrieve instructions from the memory 510 and execute the retrieved instructions to control the operation of the current feedback circuit 200. In certain instances, the electronic processor 505 executes instructions stored in the memory 510 to perform methods described herein.

The input/output devices 515 may include, for example, a display, a microphone, a speaker, a push-to-talk mechanism, or other components of a wireless device that provide inputs to and outputs from the controller 500. For example, upon detecting actuation of a push-to-talk mechanism, the controller 500 determines a TX session beginning or TX slot beginning. The controller 500 may generate commands based on the transmission status of the wireless device, such as the current limitation enable command and the external reset control command provided to the logic circuit 216. Additionally, the controller 500 may generate the PA_ON command to activate the RFPA 204 to initiate transmission.

Figure 6:
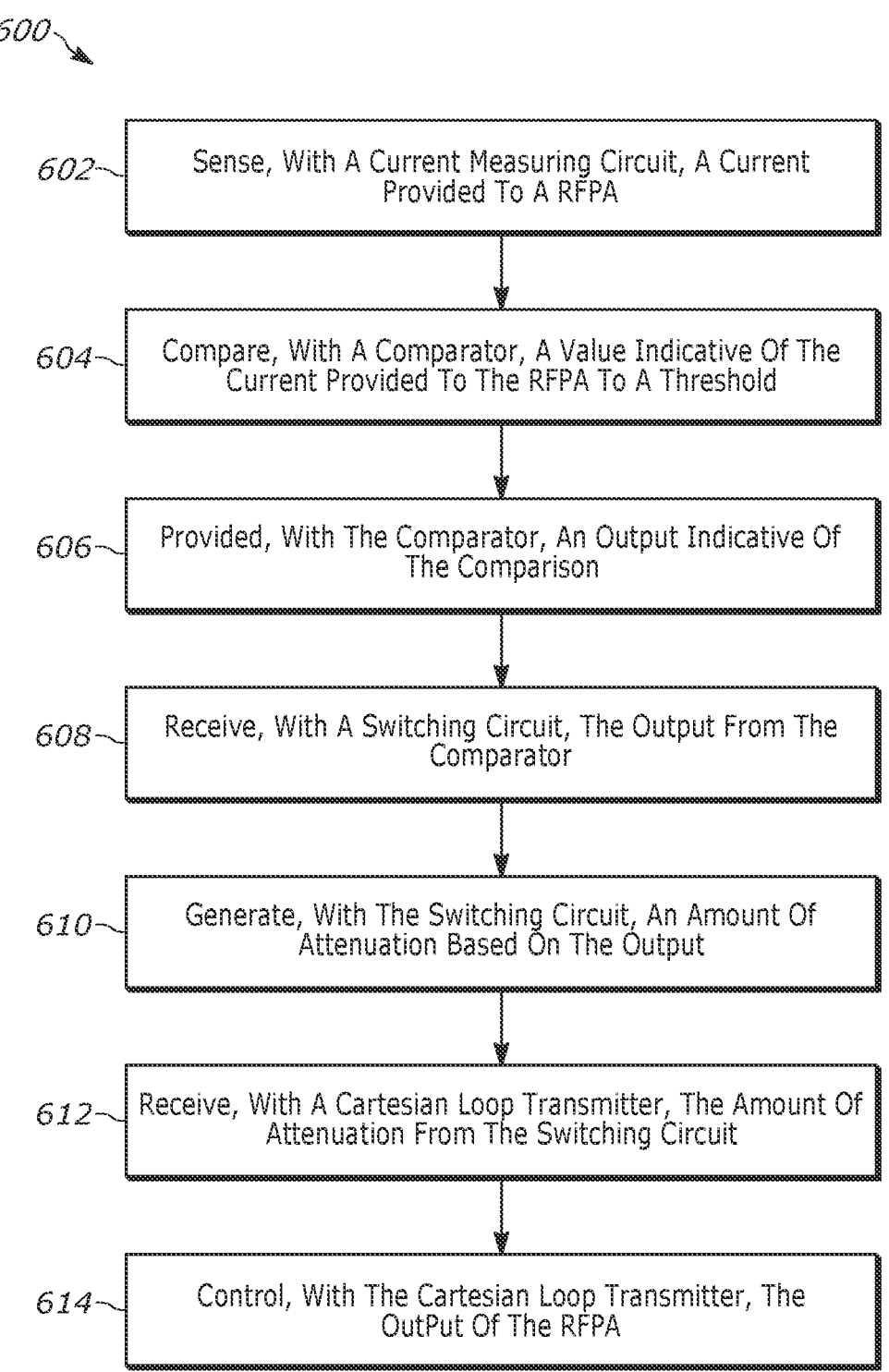
FIG. 6 is a block diagram of a method performed by the current feedback circuit of FIG. 2, according to one example.

FIG. 6 provides a method 600 for current control in a wireless communication device. The method 600 may be performed by the controller 500, the current feedback circuit 200, the attenuator circuit 300, the attenuator circuit 400, or a combination thereof. The steps of the method 600 are described in an iterative manner for descriptive purposes. Various steps described herein with respect to the method 600 are capable of being executed simultaneously, in parallel, or in an order that differs from the illustrated serial and iterative manner of execution.

At block 602, the method 600 includes sensing, with the current measuring circuit 208, a current provided to the RFPA 204. At block 604, the method 600 includes comparing, with the comparator, a value indicative of the current provided to the RFPA 204 to a threshold. For example, with reference to FIG. 2, the comparator 212 compares the signal from the current measuring circuit 208 to a threshold.

At block 606, the method 600 includes providing, with the comparator, an output indicative of the comparison. For example, with reference to FIG. 2, the comparator 212 provides a signal indicative of the comparison to the logic circuit 216. At block 608, the method 600 includes receiving, with a switching circuit, the output from the comparator. As one example, with reference to FIG. 2, the switching circuit 224 receives the output from the comparator 212. In some instances, the logic circuit 216 receives the signal from the comparator 212. The logic circuit 216 performs conditioning or other processing of the signal from the comparator 212, as previously described, and provide control commands to the switching circuit 224.

At block 610, the method 600 includes generating, with the switching circuit, an amount of attenuation based on the output. For example, with reference to FIG. 2, the switching circuit 224 selects either the normal operating mode or the high current operating mode, as previously described. At block 612, the method 600 includes receiving, with a Cartesian feedback loop, the amount of attenuation from the switching circuit. For example, the amount of attenuation selected by the switching circuit 224 is provided to the Cartesian feedback loop components 232. At block 614, the method 600 includes controlling, with the Cartesian feedback loop, the output of the RFPA 204.

In the foregoing specification, specific examples have been described. However, one of ordinary skill in the art appreciates that various modifications and changes may be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting example the term is defined to be within 10%, in another example within 5%, in another example within 1% and in another example within 0.5%. The term "coupled" as used herein is defined as connected, although not necessarily directly and not necessarily mechanically. A device or structure that is "configured" in a certain way is configured in at least that way but may also be configured in ways that are not listed.

It will be appreciated that some examples may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an example may be implemented as a computer-readable storage medium having computer readable code stored thereon for programming a computer (for example, comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it may be seen that various features are grouped together in various examples for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

We claim:

1. A radio comprising:
a radio frequency power amplifier (RFPA);
a current measuring circuit configured to sense a current provided to the RFPA;
a comparator connected to the current measuring circuit and configured to compare a value indicative of the current provided to the RFPA to a threshold and configured to provide an output indicative of the comparison;
a switching circuit configured to receive the output from the comparator and generate an amount of attenuation based on the output, wherein the amount of attenuation generated by the switching circuit varies proportionally to a difference between the current provided to the RFPA and a first reference voltage; and
a Cartesian feedback loop configured to receive the amount of attenuation and control the output of the RFPA.

2. The radio of claim 1, further comprising:
a digital logic circuit connected between the comparator and the switching circuit, the digital logic circuit configured to receive the output from the comparator and select an operating mode,
wherein the switching circuit is configured to receive the operating mode from the digital logic circuit.

3. The radio of claim 2, wherein the digital logic circuit includes:
a NOR gate configured to receive the output from the comparator and a current limitation enable command to generate a NOR gate output; and
a Flip-Flop configured to generate control commands for the switching circuit based on the NOR gate output.

4. The radio of claim 3, wherein the Flip-Flop is configured to generate the control commands further based on an external reset control command indicating at least one selected from the group consisting of a transmission slot beginning associated with a radio and a transmission session beginning associated with the radio.

5. The radio of claim 1, wherein the switching circuit is configured to generate the amount of attenuation by selecting one of either a first attenuation value or a second attenuation value different from the first attenuation value.

6. The radio of claim 5, wherein, when the value indicative of the current is less than the threshold, the switching circuit is configured to select the first attenuation value, and wherein, when the value indicative of the current is greater than or equal to the threshold, the switching circuit is configured to select the second attenuation value, wherein the second attenuation value is less than the first attenuation value.

7. The radio of claim 1, wherein the switching circuit includes a variable voltage attenuator configured to provide the amount of attenuation to the Cartesian feedback loop based on the output from the comparator.

8. The radio of claim 1, wherein the switching circuit includes a filtering circuit configured to apply a logic circuit, a level shifting circuit, and a low-pass filter to the output of the comparator.

9. The radio of claim 1, wherein the output is indicative of a different between the value indicative of the current provided to the RFPA and the threshold.

10. The radio of claim 1, wherein the switching circuit is configured to:

generate a first attenuation value when the output of the comparator is greater than the threshold; and generate, in response to the end of a transmission session of the radio, a second attenuation value.

11. The radio of claim 1, wherein the radio is capable of operation in a Terrestrial Trunked Radio (TETRA) communication system.

12. A method for current control in a radio, the method comprising:

sensing, with a current measuring circuit, a current provided to a radio frequency power amplifier (RFPA);

comparing, with a comparator connected to the current measuring circuit, a value indicative of the current provided to the RFPA to a threshold;

providing, with the comparator, an output indicative of the comparison;

receiving, with a switching circuit, the output from the comparator;

generating, with the switching circuit, an amount of attenuation based on the output, wherein the amount of attenuation varies proportionally to a difference between the current provided to the RFPA and a first reference voltage;

receiving, with a Cartesian feedback loop, the amount of attenuation from the switching circuit; and controlling, with the Cartesian feedback loop, the output of the RFPA.

13. The method of claim 12, further comprising:

receiving, with a digital logic circuit connected between the comparator and the switching circuit, the output from the comparator;

selecting, with the digital logic circuit, an operating mode based on the output; and providing, with the digital logic circuit, the operating mode to the switching circuit.

14. The method of claim 13, further comprising:

selecting, with the digital logic circuit, the operating mode based on an external reset control command indicating at least one selected from a group consisting of a transmission slot beginning associated with a radio and a transmission session beginning associated with the radio.

15. The method of claim 12, further comprising:

generating, with the switching circuit, the amount of attenuation by selecting one of either a first attenuation value or a second attenuation value different from the first attenuation value.

16. The method of claim 15, further comprising:

selecting, with the switching circuit and when the value indicative of the current is less than the threshold, the first attenuation value; and selecting, with the switching circuit and when the value indicative of the current is greater than or equal to the threshold, the second attenuation value, wherein the second attenuation value is less than the first attenuation value.

17. The method of claim 12, wherein generating, with the switching circuit, an amount of attenuation based on the output includes providing, with a variable voltage attenuator included in the switching circuit, the amount of attenuation to the Cartesian feedback loop based on the output from the comparator.

18. The method of claim 12, further comprising applying, with a filtering circuit included in the switching circuit, a logic circuit, a level shifting circuit, and a low-pass filter to the output of the comparator.

19. The method of claim 12, wherein the output is indicative of a difference between the value indicative of the current provided to the RFPA and the threshold.

20. The method of claim 12, further comprising:

generating, with the switching circuit, a first attenuation value when the output of the comparator is greater than the threshold; and generating, with the switching circuit and in response to the end of a transmission session of a radio, a second attenuation value.

* * * * *